(12) United States Patent
Tsai

(10) Patent No.: US 7,988,473 B2
(45) Date of Patent: Aug. 2, 2011

(54) ELECTRICAL CARD CONNECTOR HAVING A SHIELD ASSISTING IN RETAINING AN INSERTED CARD TO A SLIDER

(75) Inventor: Tzu-Ching Tsai, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/786,461

(22) Filed: May 25, 2010

(65) Prior Publication Data

US 2010/0297862 A1  Nov. 25, 2010

(30) Foreign Application Priority Data

May 25, 2009  (TW) ................................ 98209158 U

(51) Int. Cl.
*H01R 13/62*  (2006.01)
(52) U.S. Cl. ....................................................... 439/159
(58) Field of Classification Search .................. 439/159, 439/160
See application file for complete search history.

(56) References Cited

U.S. PATENT DOCUMENTS

| | | | | |
|---|---|---|---|---|
| 6,039,587 A * | 3/2000 | Oguchi | ......................... | 439/159 |
| 6,142,801 A * | 11/2000 | Koseki et al. | ................. | 439/159 |
| 6,319,028 B1 * | 11/2001 | Zhang et al. | ................... | 439/159 |
| 6,814,596 B2 * | 11/2004 | Yu et al. | ......................... | 439/159 |
| 6,962,500 B1 * | 11/2005 | Chen | .............................. | 439/159 |
| 7,381,094 B2 * | 6/2008 | Miyao et al. | ................... | 439/630 |
| 7,491,074 B1 * | 2/2009 | Lai | ................................ | 439/159 |

FOREIGN PATENT DOCUMENTS

CN        2852449        12/2006

* cited by examiner

*Primary Examiner* — Chandrika Prasad
(74) *Attorney, Agent, or Firm* — Ming Chieh Chang; Wei Te Chung; Andrew C. Cheng

(57) ABSTRACT

An electrical card connector (100), used for receiving a card (6) having a cutout (61), includes an insulative housing (1), a plurality of contacts (2) retained in the insulative housing, a metal shield (3) covering the insulative housing to define a card receiving room (8) and a card inserting port, and an ejector (4) assembled on the insulative housing. The metal shield includes a main plate (31) and a pair of vertical walls (32) extending from the main plate. A ridge (321) is formed at one of the vertical walls. The ejector includes a slider (41), a spring member (42) and a pin member (43) for cooperatively guiding/ejecting a card. The slider has a main portion (41) extending along the card's insertion/ejection direction. The main portion forms a protruding portion (412) facing toward the card receiving room and a confronting portion (413) facing toward the one vertical wall. The protruding portion is engaged with the cutout of the card when the card is moved into a locked position in such a manner that the ridge leans against the confronting portion and presses the slider towards the card receiving room.

13 Claims, 4 Drawing Sheets

ELECTRICAL CARD CONNECTOR HAVING A SHIELD ASSISTING IN RETAINING AN INSERTED CARD TO A SLIDER

BACKGROUND OF THE INVENTION

1. Field of the Invention

The present invention relates generally to a card connector, and more particularly to a card connector with self-locking mechanism.

2. Description of Related Arts

Chinese Patent No. 2852449 discloses an electrical card connector comprising an insulating frame, a plurality of conductive terminals retained in the insulating frame, a metal cover shielding over the insulating frame for defining a card receiving space, and an ejector which is arranged on the insulating frame for guiding the insertion and the ejection of a card. The card ejector comprises a slider, a pin member and a spring element. The slider comprises a linking portion contacting with the card and moving accompanying with the card at an end far away from an inserting port, and a protruding portion at an opposite end near to the inserting port for engaging with the card. The slider defines a heart-shaped slot wherein the pin member slides during the card's insertion/ejection. The slider further defines a recess with a width at the end far away from the inserting port larger than the end near to the inserting port. In the card's insertion, the card pushes the linking portion, the spring element is compressed and biases against the slider in cooperation with the pin member and accordingly, the protruding portion slides along with the recess and rotates towards the card receiving space, and finally engages with a cutout defined at a side of the card. However, the deflecting movement of the slider when inserting the card decreases the reliability of the connector.

Hence, an electrical card connector with self-locking mechanism is desired.

SUMMARY OF THE INVENTION

Accordingly, an object of the present invention is to provide an electrical card connector with self-locking mechanism and accordingly, reliability of the connector is improved.

To achieve the above object, an electrical card connector, used for receiving a card having a cutout, includes an insulative housing, a plurality of contacts retained in the insulative housing, a metal shield covering the insulative housing to define a card receiving room and a card inserting port, and an ejector assembled on the insulative housing. The metal shield includes a main plate and a pair of vertical walls extending from the main plate. A ridge is formed at one of the vertical walls. The ejector includes a slider, a spring member and a pin member for cooperatively guiding/ejecting a card. The slider has a main portion extending along the card's insertion/ejection direction. The main portion forms a protruding portion facing toward the card receiving room and a confronting portion facing toward the one vertical wall. The protruding portion is engaged with the cutout of the card when the card is moved into a locked position in such a manner that the ridge leans against the confronting portion and presses the slider towards the card receiving room.

Other objects, advantages and novel features of the invention will become more apparent from the following detailed description when taken in conjunction with the accompanying drawings.

DETAILED DESCRIPTION OF THE PREFERRED EMBODIMENT

Figure 1:
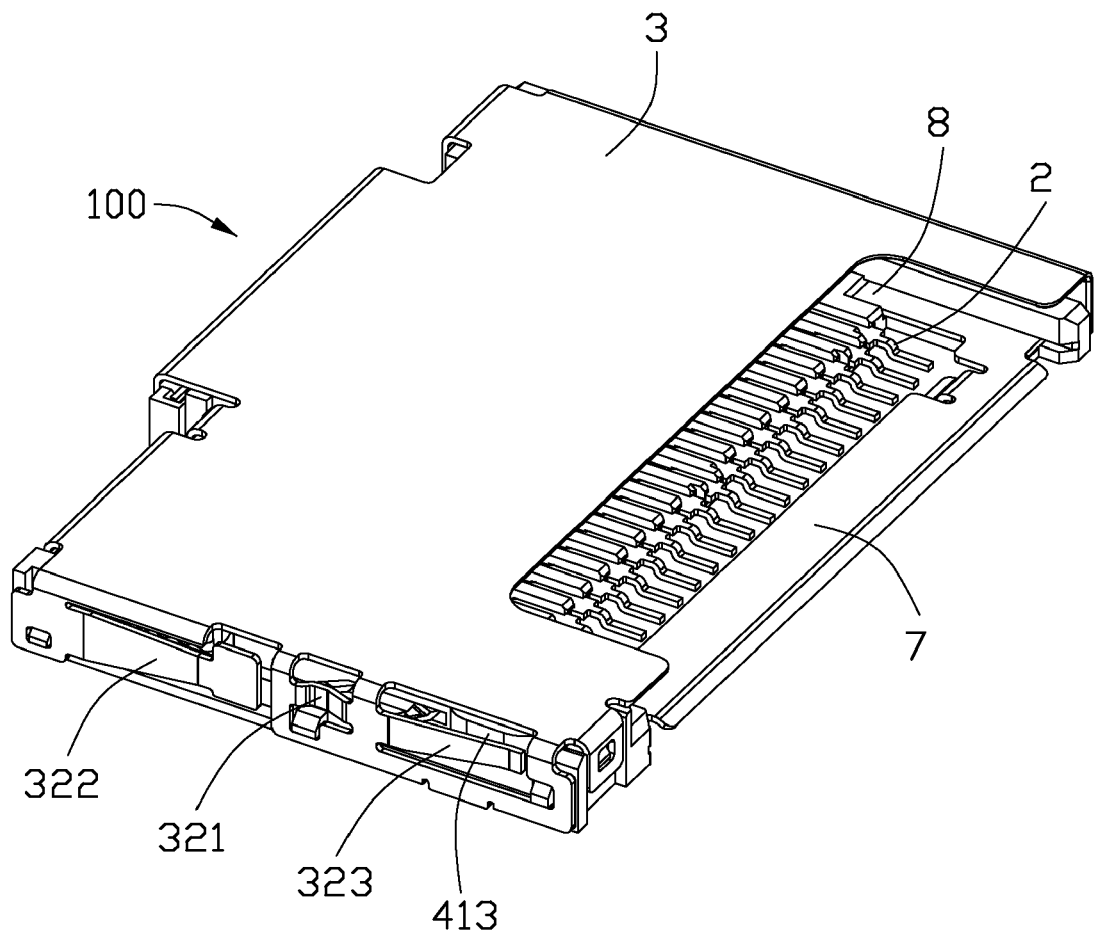
FIG. 1 is a perspective, assembled view of an electrical card connector constructed in accordance with the present invention.

Referring to FIGS. 1-4, an electrical card connector 100 of the present invention used for receiving a card 6 having a cutout 61 at a lateral edge thereof, comprises an insulative housing 1, a plurality of contacts 2 retained in the insulative housing 1, a metal shield 3 covering the insulative housing 1 for defining a card receiving room 8 therebetween and having a card inserting port (not labeled) at a back side thereof, an ejector 4 assembled on the insulative housing 1 for guiding and ejecting the card 6, a switch 5 assembled at a front side of the insulative housing 1 which is far away the card inserting port, and a grounding pad 7 assembled at the back side of the insulative housing 1. The switch 5 comprises an immoveable contact 51 and a moveable contact 52 moving towards the immoveable contact 51 and contacting with the immoveable contact 51 for detecting the insertion of the card 6.

Figure 2:
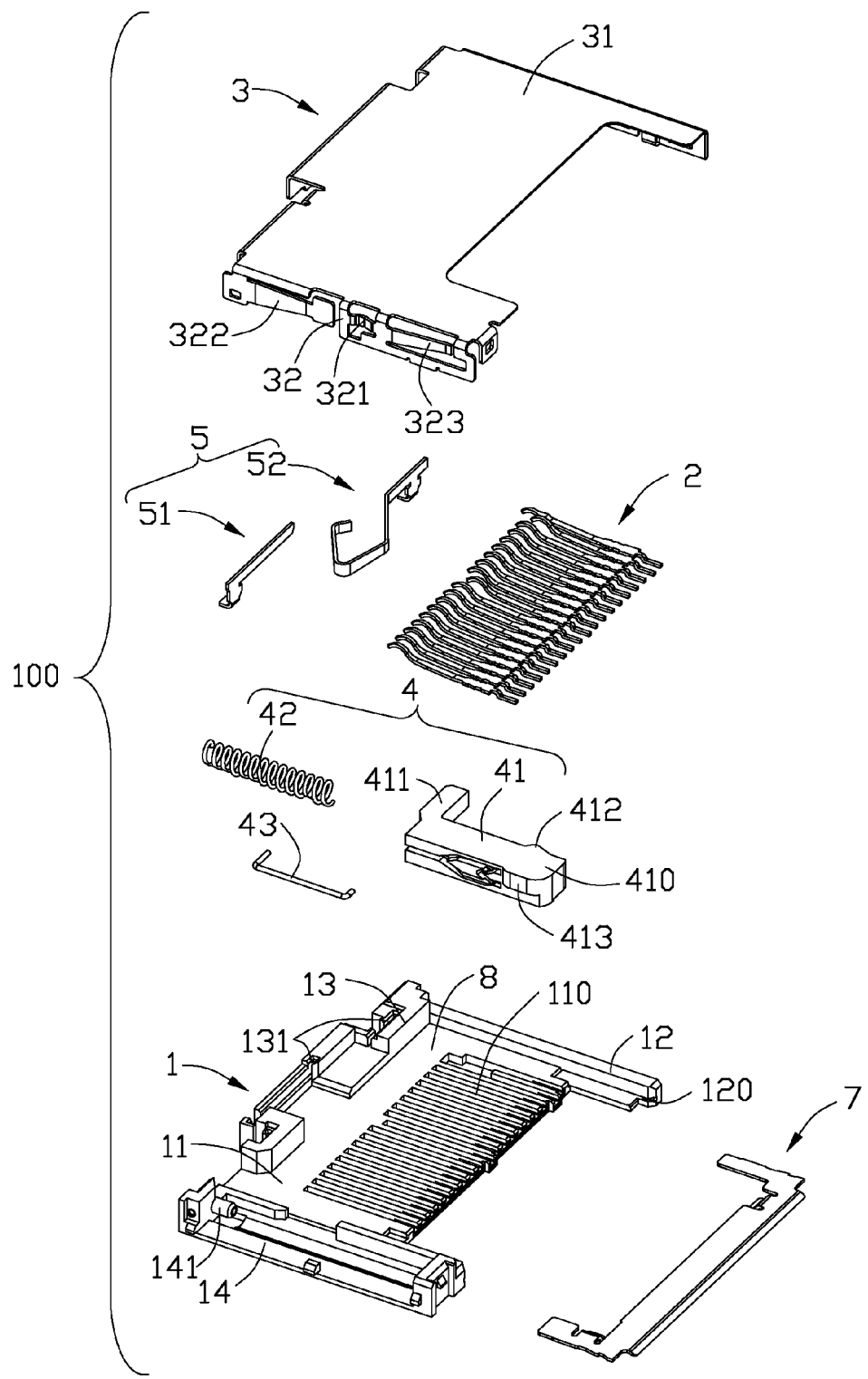
FIG. 2 is a perspective, exploded view of the electrical card connector of FIG. 1.

Referring to FIG. 2, the insulative housing 1 comprises an elongate base portion 11, a pair of lateral walls 12 extending backwardly from two edges of the base portion 11, and a block portion 13 located at the front end of the base portion 11. Each lateral wall 12 defines an inserting slit 120 for guiding the grounding pad 7. One of the lateral walls 12 is acted as a mounting arm 14 for assembling the ejector 4. The mounting arm 14 further forms a post 141 extending backwardly. The base portion 11 defines a plurality of passageways 110 extending along a card's insertion/ejection direction for retaining the contacts 2. The block portion 13 defines a pair of retaining slots 131 respectively for retaining the immoveable contact 51 and the moveable contact 52 of the switch 5.

Referring to FIG. 2, the metal shield 3 has a main plate 31 and a plurality of vertical walls 32 extending vertically from the main plate 31. One of the vertical walls 32 forms a ridge 321 with two ends connected thereto. The ridge 321 is bulged in the middle thereof towards the card receiving room 8. The vertical wall 32 further forms a first cantilevered beam 322 located at the front side of the ridge 321 and a second cantilevered beam 323 located at the back side of the ridge 321. Both the first cantilevered beam 322 and the second cantilevered beam 323 extend along the card's ejection direction with their free ends facing towards the back side of the metal shield 3.

Referring to FIGS. 1 and 2, the ejector 4 comprises a slider 41 defining a heart-shaped slot (not labeled) therein, a spring member 42 and a pin member 43 with one end locked to the insulative housing 1 and the other end moveably sliding in the heart-shaped slot during the card's insertion/ejection. The slider 41 comprises a main portion 410 and a linking portion 411 extending towards the card receiving room 8 from the main portion 410 for contacting with a front edge of the card 6 and moving accompanying with the card 6. The main portion 410 forms a protruding portion 412 at an inner side thereof which faces towards the card receiving room 8 and a confronting portion 413 protruding from an outer side thereof and facing towards the vertical wall 32 of the metal shield 3. The spring member 42 is orientated by the post 141 and compressed by the slider 41 to have elasticity during the card's insertion and releases the elasticity during the card's ejection.

Figure 3:
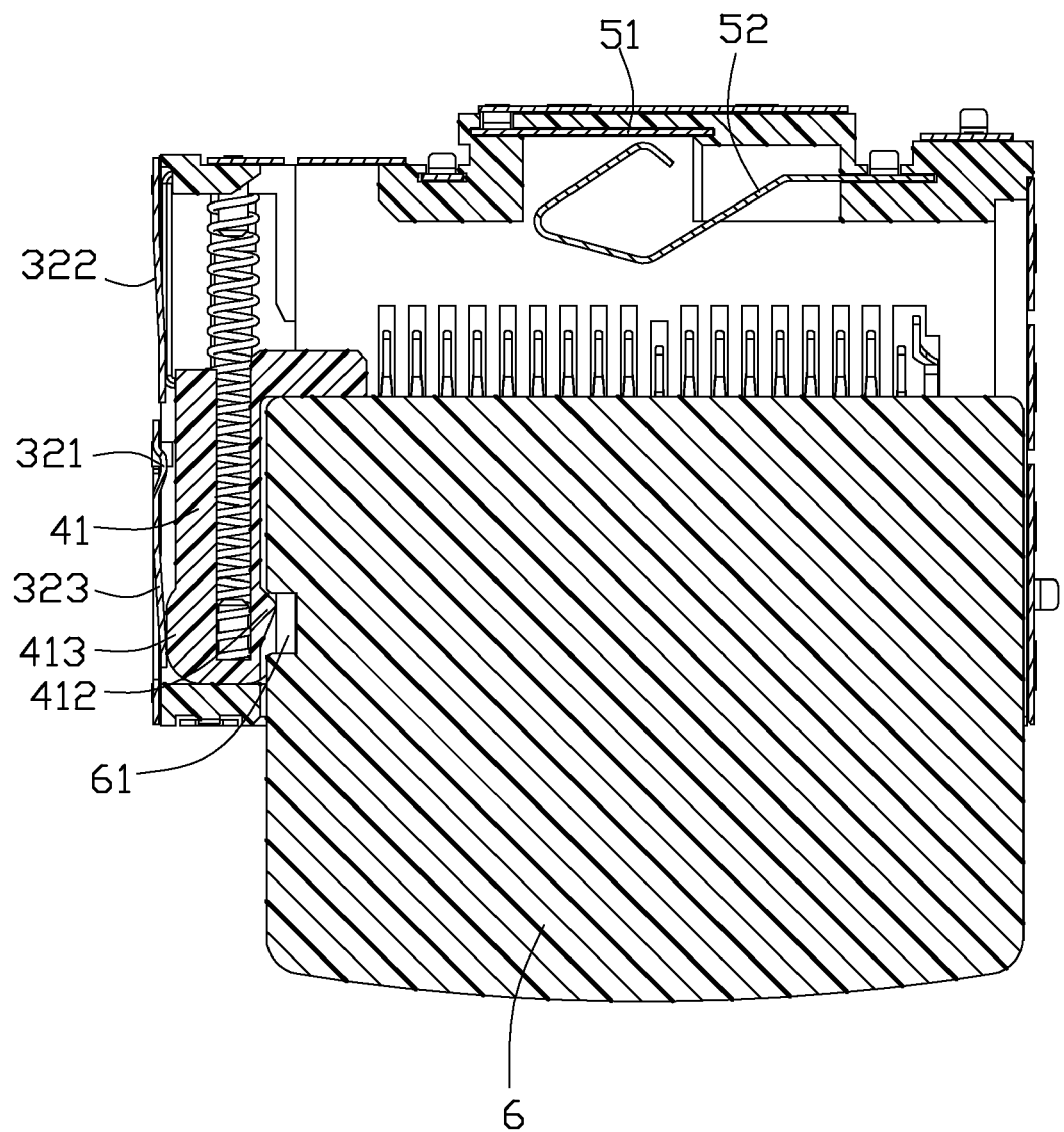
FIG. 3 is a cross-section view showing an electrical card is not fully inserted.
Figure 4:
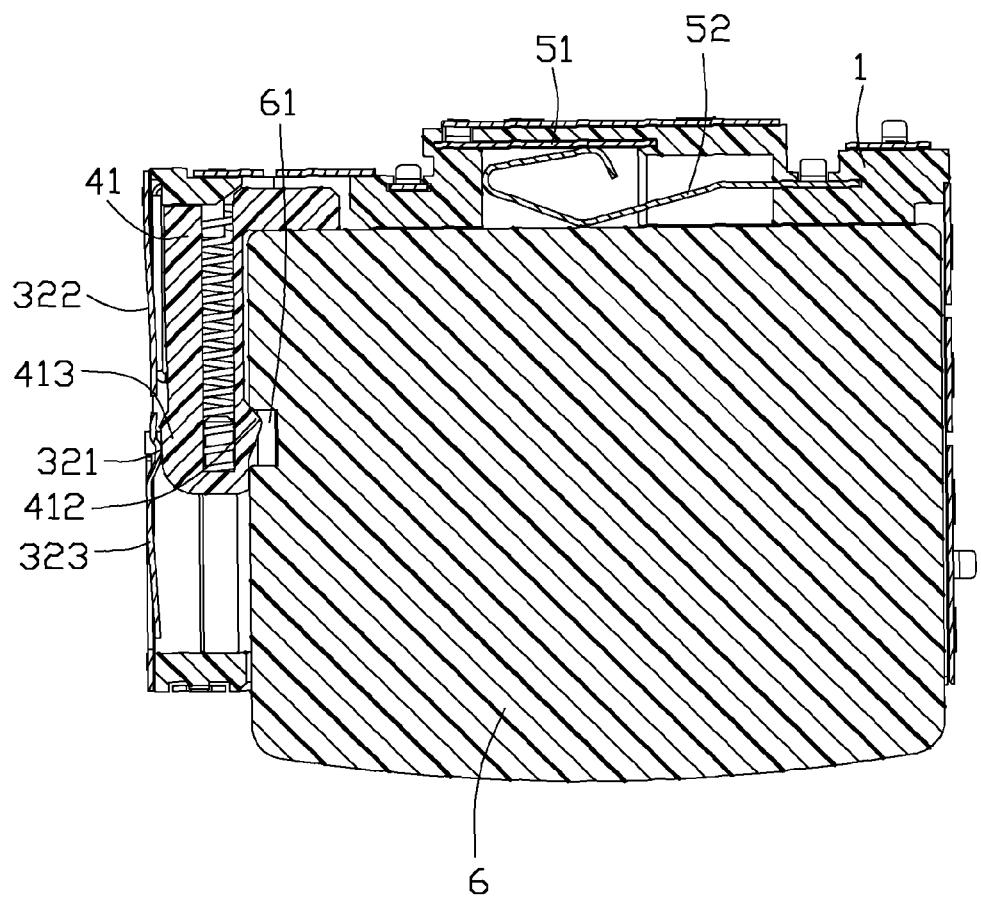
FIG. 4 is another cross-section view showing the electrical card is fully inserted.

Referring to FIGS. 1-4, and particularly referring to FIGS. 3-4 respectively a first cross-section view showing the card 6 not fully inserted into the electrical card connector 100 and a second cross-section view showing the card 6 fully inserted into the electrical card connector 100, through which the first cantilevered beam 322 constantly presses against the pin member 43 to prevent the pin member 43 from disengaging away from the heart-shaped slot. Firstly, the second cantilevered beam 323 leans against the confronting portion 413 of the slider 41 but not providing a large enough force to the slider 41 during its movement toward the card receiving room 8. The ridge 321 subsequently leans against the confronting portion 413 of the slider 41 after the portion 413 moves away from the second cantilevered beam 323. The ridge 321 provides a larger force to slider 41 than the second cantilevered beam 323 so as to push the protruding portion 412 of the slider 41 into the cutout 61 of the card 6. Therefore, the protruding portion 412 of the slider 41 is engaged with the card 6. The front edge of the card 6 presses against the moveable contact 52 to contact the immoveable contact 51. Because the ridge 321 is connected to the vertical wall 32 of the metal shield 3 with a middle part thereof bulged towards the card receiving room 8, the ridge 321 pushes the protruding portion 412 of the slider 41 into the cutout 61 of the card 6, and because the movement of the slider 41 is not so great, reliability of the electrical card connector 100 is provided.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. An electrical card connector, used for receiving a card having a cutout, comprising:
    an insulative housing;
    a plurality of contacts retained in the insulative housing;
    a metal shield covering the insulative housing to define a card receiving room, a card inserting port, and a card's insertion/ejection direction, the metal shield comprising a main plate and a pair of vertical walls extending from the main plate, a ridge being formed at one of the vertical walls, the ridge having two ends connected to the one vertical wall and being bulged towards the card receiving room; and
    an ejector assembled on the insulative housing, the ejector comprising a slider, a spring member, and a pin member for cooperatively guiding/ejecting a card, the slider having a main portion extending along the card's insertion/ejection direction, the main portion forming a protruding portion facing toward the card receiving room and a confronting portion facing toward the one vertical wall;
    wherein the protruding portion is engaged with the cutout of the card when the card is moved into a locked position in such a manner that the ridge leans against the confronting portion and presses the slider towards the card receiving room.

2. The electrical card connector as described in claim 1, wherein the metal shield comprises a cantilevered beam located beside the ridge and nearer to the card inserting port than the ridge.

3. The electrical card connector as described in claim 2, wherein the cantilevered beam is located in front of the ridge along the card insertion direction.

4. The electrical card connector as described in claim 2, wherein the metal shield comprises another cantilevered beam located beside the ridge and elastically pressing against the pin member.

5. The electrical card connector as described in claim 4, wherein both the two cantilevered beams have free ends facing toward the card inserting port.

6. The electrical card connector as described in claim 2, further comprising a switch assembled at the insulative housing far away from the card inserting port.

7. The electrical card connector as described in claim 6, wherein the switch comprises an immoveable contact and a moveable contact moving towards the immoveable contact along the card insertion direction.

8. The electrical card connector as described in claim 2, further comprising a grounding pad assembled at the insulative housing adjacent to the card inserting port.

9. The electrical card connector as described in claim 1, wherein the slider forms a linking portion extending towards the card receiving room from the main portion for abutting against a front edge of the card.

10. An electrical card connector for use with an electronic card, comprising:
    an insulative housing defining a card receiving space thereabouts for receiving said electronic card;
    a plurality of contacts disposed in the housing with contacting sections extending into the card receiving space;
    a metallic shell attached to the housing and cooperating with the housing to enclose said card receiving space; and
    an ejector assembled to one side region of the housing and defining a slider moveable relative to the housing along a front-to-back direction via assistance of a biasing device, said slider including a main portion with an integral protrusion inwardly and laterally extending into the card receiving space; wherein
    the ejector outwardly and laterally confronts a side wall of the shell under condition that the side wall of the shell defines a rigid ridge at a first position for abutting against the slider inwardly to lock the protrusion with the electronic card in a transverse direction perpendicular to said front-to-back direction and a resilient cantilevered beam at a second position for abutting against the slider to lock the protrusion with the electronic card in said transverse direction; wherein
    the slider monolithically includes a linking portion extending transversely into the card receiving space for contacting a front edge of the electronic card so as to eject the electronic card when the biasing device is released.

11. An electrical card connector for use with an electronic card, comprising:
    an insulative housing defining a card receiving space thereabouts for receiving said electronic card;
    a plurality of contacts disposed in the housing with contacting sections extending into the card receiving space;
    a metallic shell attached to the housing and cooperating with the housing to enclose said card receiving space; and
    an ejector assembled to one side region of the housing and defining a slider moveable relative to the housing along a front-to-back direction via assistance of a biasing device which essentially directly mechanically contacts the slider and applies a forward force thereon, said slider including a main portion monolithically not only with a linking portion extending transversely into the card receiving space for contacting a front edge of the electronic card for ejection consideration but also with a protrusion inwardly and laterally extending into the card receiving space and being rigid with regard to the main portion without relative movement therebetween for locking into a notch of said electronic card; wherein the ejector outwardly and laterally confronts a side wall of the shell under condition that the side wall of the shell defines a spring arm structure having at least a first abutting apex at a first position for steadily abutting against inwardly the slider in a transverse direction perpendicular to said front-to-back direction for having the protrusion securely locked into the notch of the electronic card.

12. The electrical card connector as claimed in claim 11, wherein said spring arm structure defines further a second abutting apex at a second position, for gently abutting against the slider in said transverse direction and thus having the protrusion gently locked into the notch of the electronic card, which is for preventing the electronic card from being harshly ejected out of the receiving space during ejection of the electronic card.

13. The electrical card connector as claimed in claim 11, wherein said biasing device extends into the slider and terminates around the protrusion in the transverse direction.

* * * * *